(12) United States Patent
Huang et al.

(10) Patent No.: US 6,847,104 B2
(45) Date of Patent: Jan. 25, 2005

(54) WINDOW-TYPE BALL GRID ARRAY SEMICONDUCTOR PACKAGE WITH LEAD FRAME AS CHIP CARRIER AND METHOD FOR FABRICATING THE SAME

(75) Inventors: Chien Ping Huang, Taichung (TW); Chih-Ming Huang, Taichung (TW); Jui-Yu Chuang, Taichung (TW); Lien-Chi Chan, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/377,545

(22) Filed: Feb. 27, 2003

(65) Prior Publication Data

US 2004/0080031 A1 Apr. 29, 2004

(30) Foreign Application Priority Data

Oct. 25, 2002 (TW) ...................................... 91125166 A

(51) Int. Cl.[7] .............................................. H01L 23/02
(52) U.S. Cl. ...................... 257/685; 257/686; 257/723; 257/781; 257/784
(58) Field of Search ................................ 257/685, 686, 257/723, 781, 784

(56) References Cited

U.S. PATENT DOCUMENTS

| | | | |
|---|---|---|---|
| 5,920,118 A | | 7/1999 | Kong .......................... 257/684 |
| 5,998,860 A | * | 12/1999 | Chan et al. .................. 257/679 |
| 6,144,102 A | | 11/2000 | Amagai ....................... 257/781 |
| 6,190,943 B1 | | 2/2001 | Lee et al. .................... 438/107 |
| 6,218,731 B1 | | 4/2001 | Huang et al. ................ 257/738 |
| 6,426,875 B1 | * | 7/2002 | Akram et al. ................ 361/704 |
| 6,512,303 B2 | * | 1/2003 | Moden ........................ 257/778 |
| 6,515,355 B1 | * | 2/2003 | Yin et al. .................... 257/678 |
| 6,528,722 B2 | * | 3/2003 | Huang et al. ............... 174/52.2 |
| 6,620,648 B2 | * | 9/2003 | Yang ........................... 438/107 |
| 6,686,656 B1 | * | 2/2004 | Koh et al. ................... 257/686 |
| 2002/0043709 A1 | * | 4/2002 | Yeh et al. .................... 257/686 |
| 2003/0011059 A1 | * | 1/2003 | Akram ........................ 257/678 |
| 2003/0102546 A1 | * | 6/2003 | Lee et al. .................... 257/686 |

FOREIGN PATENT DOCUMENTS

JP 411537 11/2000

* cited by examiner

Primary Examiner—Jasmine Clark
(74) Attorney, Agent, or Firm—Peter F. Corless; Steven M. Jensen; Edwards & Angell, LLP

(57) ABSTRACT

A window-type ball grid array (WBGA) semiconductor package with a lead frame as a chip carrier and a method for fabricating the same are provided. The lead frame has a plurality of leads encompassing an opening, each lead having an upper surface and an opposing lower surface. A resin material is pre-molded on the lower surfaces of the leads, with wire-bonding portions and ball-implanting portions defined on the leads being exposed. At least a chip is mounted on the upper surfaces of the leads and covers the opening, allowing the chip to be electrically connected to the wire-bonding portions of the leads by a plurality of bonding wires via the opening. Then, an encapsulant is formed to encapsulate the chip and fill into the opening for encapsulating the bonding wires. Finally, solder balls are implanted on the ball-implanting portions of the leads to complete fabrication of the semiconductor package.

17 Claims, 5 Drawing Sheets

WINDOW-TYPE BALL GRID ARRAY SEMICONDUCTOR PACKAGE WITH LEAD FRAME AS CHIP CARRIER AND METHOD FOR FABRICATING THE SAME

FIELD OF THE INVENTION

The present invention relates to semiconductor packages and fabrication methods thereof, and more particularly, to a window-type ball grid array (WBGA) semiconductor package with a lead frame as a chip carrier, and a method for fabricating the semiconductor package.

BACKGROUND OF THE INVENTION

A window-type ball grid array (WBGA) semiconductor package is characterized in the use of a substrate formed with at least an opening (so-called "window") penetrating through the same, wherein a chip is mounted on a surface of the substrate and covers the opening, a plurality of bonding wires are formed for electrically connecting the chip to the substrate via the opening of the substrate, and a plurality of solder balls are implanted on an opposing surface of the substrate for electrically connecting the chip to an external device. This package structure is suitably used for accommodating central-pad chips and yields significant benefits in terms of reducing wire length and structural profile of the semiconductor package.

A conventional WBGA semiconductor package, as shown in FIG. 6A, uses a substrate 10 having an upper surface 100 and a lower surface 101 and formed with an opening 102 penetrating through the substrate 10. A chip 11 is mounted on the upper surface 100 of the substrate 10 and covers the opening 102 in a face-down manner that bond pads 111 formed on an active surface 110 of the chip 11 are exposed via the opening 102. A plurality of bonding wires 12 are bonded to the bond pads 111 of the chip 11 and to the lower surface 101 of the substrate 10 via the opening 102 for electrically connecting the chip 11 to the substrate 10. Then, a lower encapsulant 13 is formed on the lower surface 101 of the substrate 10 for filling into the opening 102 and encapsulating the bonding wires 12, and an upper encapsulant 14 is formed on the upper surface 100 of the substrate 10 for encapsulating the chip 11. Finally, a plurality of solder balls 15 are implanted on the lower surface 101 of the substrate 10 at area free of the lower encapsulant 13, and act as input/output (I/O) connections for electrically connecting the chip 11 to an external device such as printed circuit board (PCB, not shown). Related prior arts include U.S. Pat. Nos. 5,920,118, 6,144,102, 6,190,943 and 6,218,731, wherein U.S. Pat. No. 5,920,118 uses a ceramic substrate as a chip carrier, and U.S. Pat. Nos. 6,144,102, 6,190,943 and 6,218,731 adopt a substrate made of an organic material such as BT (bismaleimide triazine) resin for accommodating chips; however, the ceramic or organic substrate is quite expensive in fabrication, making production costs of the semiconductor package undesirably increased.

Taiwan Patent Publication No. 411537 discloses a WBGA semiconductor package using a lead frame as a chip carrier, wherein the lead frame is composed of a plurality of leads, and a chip is mounted on a surface of the leads. Solder mask is applied over an opposing surface of the leads and formed with a plurality of openings for exposing predetermined ball-implanting portions on the leads where solder balls are bonded. However, this package structure causes significant drawbacks; one is that the process for applying solder mask over the leads is complex and cost-ineffective to perform, and gaps between adjacent leads are hardly filled by solder mask. Moreover, solder mask has relatively high moisture absorbability, which makes moisture easily accumulate in solder mask applied on the leads and leads to delamination at interface between solder mask and the leads.

Furthermore, the above semiconductor package in the use of a substrate or lead frame would be easily subject to a resin flash problem. For example of the package structure shown in FIG. 6A, when a molding process is performed for forming the upper encapsulant 14 and the lower encapsulant 13 on the substrate 10, as shown in FIG. 6B, the substrate 10 mounted with the chip 11 and bonding wires 12 is placed in an encapsulation mold 16 having an upper mold 17 and a lower mold 18, allowing the substrate 10 to be clamped between the upper and lower molds 17, 18. The upper mold 17 is formed with an upwardly recessed cavity 170 for accommodating the chip 11, and the lower mold 18 is formed with a downwardly recessed cavity 180 corresponding in position to the opening 102 of the substrate 10 for receiving the bonding wires 12 within the downwardly recessed cavity 180. When a resin material such as epoxy resin is injected into the encapsulation mold 16, it would fills into the upwardly recessed cavity 170 and the downwardly recessed cavity 180 to form the upper and lower encapsulants 14, 13 that respectively encapsulate the chip 11 and the bonding wires 12. However, due to a larger area on the substrate 10 being covered by the upwardly recessed cavity 170 than by the downwardly recessed cavity 180, a portion NC of the lower surface 101 of the substrate 10 adjacent to the lower encapsulant 13 can not be firmly clamped by the upper mold 17 or lacks clamping force from the upper mold 17, such that the resin material would easily flash to the portion NC of the lower surface 101 of the substrate 10 and contaminate predetermined ball-implanting portions formed on the lower surface 101 of the substrate 10 (as indicated by arrows in FIG. 6C). This flash contamination makes solder balls 15 not completely or securely bonded to the contaminated ball-implanting portions of the substrate 10, and thus degrades quality of electrical connection for fabricated package products.

Therefore, the problem to be solved herein is to provide a WBGA semiconductor package that can eliminate the above drawbacks in order to reduce fabrication costs and prevent delamination and resin flash from occurrence.

SUMMARY OF THE INVENTION

A primary objective of the present invention is to provide a window-type ball grid array (WBGA) semiconductor package with a lead frame as a chip carrier and a method for fabricating the same, whereby fabrication costs of the semiconductor package can be effectively reduced without having to use an expensive substrate as a chip carrier.

Another objective of the invention is to provide a WBGA semiconductor package with a lead frame as a chip carrier and a method for fabricating the same in which a resin material (instead of conventional solder mask) is pre-molded on the lead frame to solve the problem of delamination between solder mask and the lead frame, thereby assuring reliability of the semiconductor package.

A further objective of the invention is to provide a WBGA semiconductor package with a lead frame as a chip carrier and a method for fabricating the same, which can prevent resin flash over ball-implanting portions defined on the lead frame, so as to allow solder balls to be completely and securely bonded to the flash-free ball-implanting portions, making electrical quality and yield of fabricated package products both assured.

A further objective of the invention is to provide a WBGA semiconductor package with a lead frame as a chip carrier and a method for fabricating the same, whereby the semiconductor package is manufactured by current techniques or processes, thereby not increasing process complexity in fabrication.

In accordance with the above and other objectives, the present invention proposes a WBGA semiconductor package with a lead frame as a chip carrier, comprising: a lead frame having a plurality of leads that encompass an opening penetrating through the lead frame, wherein each of the leads has a terminal toward the opening, an upper surface, and a lower surface opposed to the upper surface and defined with a wire-bonding portion and a ball-implanting portion thereon; a first resin material pre-molded on the lower surfaces and terminals of the leads, allowing the wire-bonding portions and ball-implanting portions to be exposed to outside of the first resin material; at least a chip having an active surface and a non-active surface opposed to the active surface, wherein the active surface is mounted on the upper surfaces of the leads and covers the opening of the lead frame, allowing a plurality of bond pads formed on the active surface to be exposed to the opening; a plurality of bonding wires for electrically connecting the bond pads of the chip to the wire-bonding portions of the leads via the opening of the lead frame; an encapsulant formed on the lead frame, the encapsulant having a first portion and a second portion, wherein the first portion is formed on the upper surfaces of the leads for encapsulating the chip, and the second portion of the encapsulant fills into the opening for encapsulating the bonding wires; and a plurality of solder balls implanted at the ball-implanting portions of the leads. The second portion of the encapsulant has an exposed bottom surface that is flush with an exposed surface of the first resin material.

In another embodiment, a second resin material is pre-molded on the upper surfaces of the leads, allowing the active surface of the chip to be mounted on the second resin material that is interposed between the chip and the lead frame and encapsulated by the first portion of the encapsulant; the second resin material can be the same material as the first resin material. Moreover, a wire-bonding corresponding portion and a ball-implanting corresponding portion are defined on the upper surface of each of the leads, and respectively correspond in position to the wire-bonding portion and the ball-implanting portion on the lower surface of each of the leads; the wire-bonding corresponding portion and the ball-implanting corresponding portion are exposed to outside of the second resin material.

The above WBGA semiconductor package yields significant benefits; a lead frame serves as a chip carrier without having to use an expensive substrate (such as ceramic substrate, organic substrate, etc.), making fabrication costs of the semiconductor package effectively reduced. Moreover, a resin material (instead of conventional solder mask) is pre-molded on leads of the lead frame; compared to solder mask, the resin material has better adhesion to the leads and smaller moisture absorbability than solder mask, and thus helps prevent delamination between the resin material and leads from occurrence. The resin material can be pre-molded on the lead frame before fabrication of the WBGA package, thereby not increasing process complexity for package fabrication. During pre-molding the resin material, the leads of the lead frame are tightly clamped by a mold without having resin flash formed on wire-bonding portions and ball-implanting portions of the leads, so as to allow bonding wires to be completely bonded to the wire-bonding portions. Furthermore, in a molding process for forming an encapsulant on the lead frame, the encapsulant filling into the opening for encapsulating the bonding wires has its exposed surface flush with an exposed surface of the resin material pre-molded on the leads. This flush arrangement makes the encapsulant not protrude beyond the resin material and thus not flash to the ball-implanting portions of the leads, such that solder balls can be completely bonded to the ball-implanting portions, and electrical-connection quality and yield of the semiconductor package can be assured.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a window-type ball grid array (WBGA) semiconductor package with a lead frame as a chip carrier and a method for fabricating the same are described with reference to FIGS. 1A–1B, 2A–2E, 3A–3C, 4 and 5A–5B.

First Preferred Embodiment

Figure 1A:
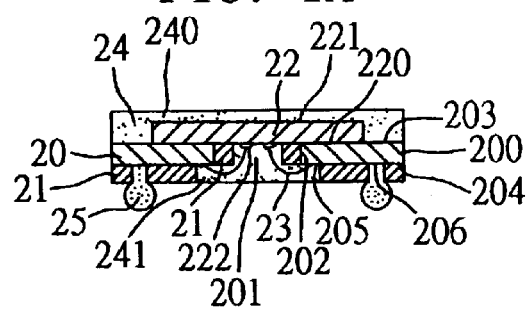
FIG. 1A is a cross-sectional view of a semiconductor package according to a first preferred embodiment of the invention.
Figure 1B:
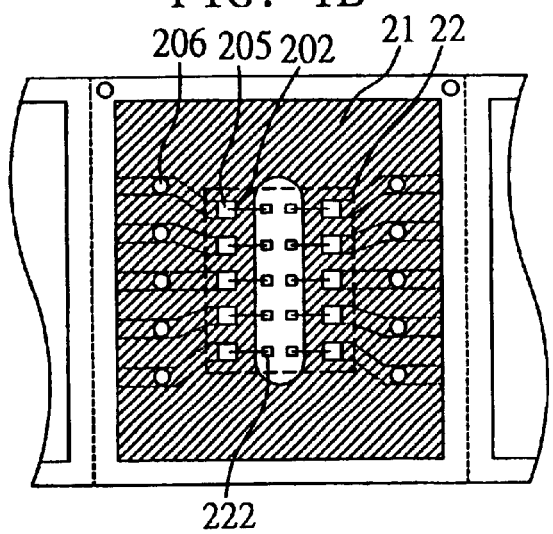
FIG. 1B is a bottom view of the semiconductor package shown in FIG. 1A with wire-bonding portions and ball-implanting portions of a lead frame being exposed to outside of a first resin material.

As shown in FIG. 1A, the WBGA semiconductor package according to a first preferred embodiment of the invention uses a lead frame 20 as a chip carrier for accommodating chips. The lead frame 20 is composed of a plurality of leads 200 that encompass an opening 201 penetrating through the lead frame 20, wherein each of the leads 200 has a terminal 202 toward the opening 201, an upper surface 203, and a lower surface 204 opposed to the upper surface 203 and defined with a wire-bonding portion 205 and a ball-implanting portion 206 thereon. A first resin material 21 is pre-molded on the lower surfaces 204 and terminals 202 of the leads 200, allowing the wire-bonding portions 205 and ball-implanting portions 206 of the lower surfaces 204 to be exposed to outside of the first resin material 21, as shown in FIG. 1B. At least a chip 22 is mounted on the lead frame 20 and covers the opening 201; the chip 22 has an active surface 220 and a non-active surface 221 opposed to the active surface 220, wherein the active surface 200 is mounted on the upper surfaces 203 of the leads 200, and a plurality of bond pads 222 formed on the active surface 220 are exposed to the opening 201 of the lead frame 20. The chip 22 is electrically connected to the lead frame 20 by means of a plurality of bonding wires 23 that penetrate through the opening 201 and are bonded to the bond pads 222 of the chip 22 and the wire-bonding portions 205 of the leads 200. An encapsulant 24 is formed on the lead frame 20, and has a first portion 240 and a second portion 241, wherein the first portion 240 is formed on the upper surfaces 203 of the leads 200 for encapsulating the chip 22, and the second portion 241 of the encapsulant 24 fills into the opening 201 of the lead frame 20 for encapsulating the bonding wires 23. Moreover, a plurality of solder balls 25 are implanted at the ball-implanting portions 206 of the leads 200, and act as input/output (I/O) connections for electrically correcting the chip 22 to an external device (not shown).

The above WBGA semiconductor package can be fabricated by process steps illustrated in FIGS. 2A to 2E; a batch fabrication method is depicted herein, which should not confine the scope embraced by this invention.

Figure 2A:
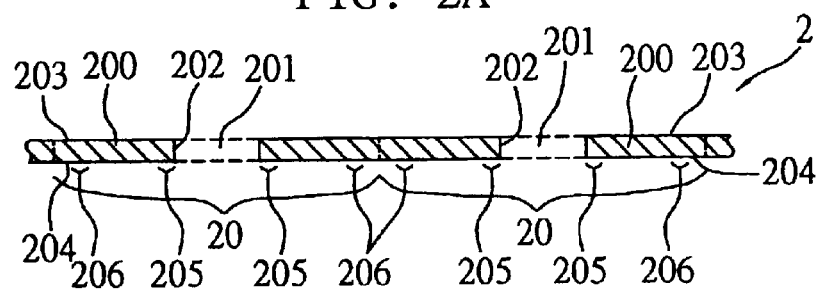
FIGS. 2A–2E are schematic diagrams for fabricating the semiconductor package according to the first preferred embodiment of the invention.

Referring to FIG. 2A, the first step is to prepare a lead-frame strip 2 integrally formed of a plurality of lead frames 20 (adjacent lead frame 20 are delimited by dotted lines shown in the drawing). Each of the lead frames 20 is composed of a plurality of leads 200 that encompass an opening 201 penetrating through the lead frame 20, wherein each of the leads 200 has a terminal 202 toward the opening 201, an upper surface 203, and a lower surface 204 opposed to the upper surface 203 and defined with a wire-bonding portion 205 and a ball-implanting portion 206 thereon.

Figure 2B:
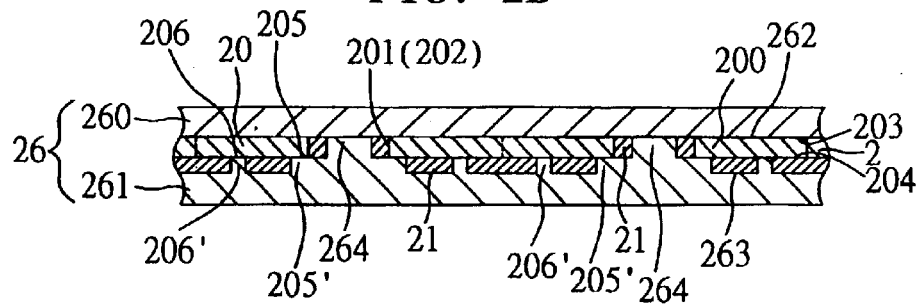

Referring to FIG. 2B, the next step is to perform a pre-molding process; the lead-frame strip 2 is placed in a pre-formed mold 26 having an upper mold 260 and a lower mold 261, and clamped between the upper and lower molds 260, 261. A top surface 263 of the lower mold 261 is formed with a plurality of protrusions 205' corresponding in position to the wire-bonding portions 205, protrusions 206' corresponding in position to the ball-implanting portions 206, and protrusions 264 corresponding in position to the openings 201 of the lead frames 20, wherein the protrusions 264 are smaller in dimension than the openings 201.

When the upper mold 260 is engaged with the lower mold 261 to clamp the substrate 10 therebetween, the upper surfaces 203 of the leads 200 abut against a bottom surface 262 of the upper mold 260, and the lower surfaces 204 of the leads 200 abut against the protrusions 205', 206', 264 of the lower mold 261. The wire-bonding portions 205 and ball-implanting portions 206 on the lower surfaces 204 of the leads 200 are closely in contact with the protrusions 205', 206' of the lower mold 261, and the protrusions 264 of the lower mold 261 come into contact with the bottom surface 262 of the upper mold 260 via the openings 201 of the lead frames 20 with gaps being left between the protrusions 264 and side walls of corresponding openings 201 (or terminals 202 of the leads 202). Then, a first resin material 21 is injected into the mold 26, and fills into gaps between the top surface 263 of the lower mold 261 and the lower surfaces 204 of the leads 200 and the gaps between the protrusions 264 and openings 201 (or terminals 202). As a result, the first resin material 21 is pre-molded on the lower surfaces 204 and terminals 202 of the leads 200 without flashing to the upper surfaces 203, wire-bonding portions 205 and ball-implanting portions 206 of the leads 200, making the wire-bonding portions 205 and ball-implanting portions 206 exposed to outside of the first resin material 21. After completing the pre-molding process, the mold 26 is removed from the lead-frame strip 2 and the lead-frame strip 2 is completely fabricated. The first resin material 21 formed on the lower surfaces 204 of the leads 200 has a predetermined thickness depending on a height of the protrusions 205', 206' of the lower mold 261, and the first resin material 21 together with the wire-bonding portions 205 of the leads 200 form a space sufficient for accommodating wire loops of bonding wires (not shown) subsequently.

Formation of the first resin material 21 on the lead frames 20 is not limited to the above pre-molding process; it should be understood that other suitable techniques, such as printing, glob-top and so on, are also applicable in the invention.

Figure 2C:
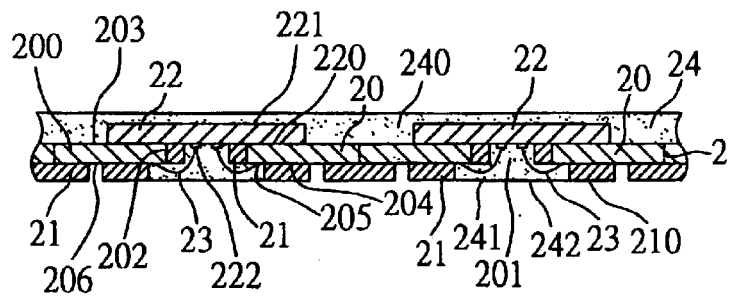

Referring to FIG. 2C, a die-bonding process is performed to mount at least a chip 22 on each of the lead frames 20 of the lead-frame strip 2. The chip 22 has an active surface 220 and a non-active surface 221 opposed to the active surface 220, wherein the active surface 220 of the chip 22 is attached via an adhesive (not shown) to the upper surfaces 203 of the leads 200 and covers the opening 201 of the corresponding lead frame 20, allowing a plurality of bond pads 222 formed on the active surface 220 to be exposed to the opening 201.

A wire-bonding process is carried out to form a plurality of bonding wires 23 for electrically connecting the chip 22 to the corresponding lead frame 20 via the opening 201 of the lead frame 20. The bonding wires 23 are bonded to the bond pads 222 of the chip 22 and the wire-bonding portions 205 of the leads 200, so as to electrically connect the active surface 220 of the chip 22 to the lower surfaces 204 of the leads 200. With the terminals 202 of the leads 200 being encapsulated by the first resin material 21, the bonding wires 23 penetrating through the opening 201 would not come into contact with the terminals 202, thereby preventing short-circuiting or poor electrical connection from occurrence. Moreover, the thickness of the first resin material 21 pre-molded on the lower surfaces 204 of the leads 200 is greater than a height of wire loops of the bonding wires 23 protruding from the lower surfaces 204 of the leads 200, such that the bonding wires 23 can be comfortably received in the space formed by the first resin material 21 and wire-bonding portions 205 of the leads 200.

A molding process is performed and utilizes a conventional encapsulation mold (not shown) for forming an encapsulant 24 by a resin material (such as epoxy resin) on the lead-frame strip 2. The encapsulant 24 has a first portion 240 and a second portion 241, wherein the first portion 240 is formed on the upper surfaces 203 of the leads 200 for encapsulating all the chips 22 mounted on the lead frames 20, and the second portion 241 of the encapsulant 24 fills into the openings 201 of the lead frames 20 for encapsulating all the bonding wires 23 formed in the openings 201. As the thickness of the first resin material 21 on the lower surfaces 204 of the leads 200 is greater than the height of wire loops of the bonding wires 23 protruding from the lower surfaces 204 of the leads 200, an exposed bottom surface 242 of the second portion 241 of the encapsulant 24 can be made flush with an exposed surface 210 of the first resin material 21, with the bonding wires 23 being completely encapsulated by the encapsulant 24. This flush arrangement makes the second portion 241 of the encapsulant 24 not protrude beyond the first resin material 21 and thus not flash to unintended area such as the ball-implanting portions 206 of the leads 200.

Figure 2D:
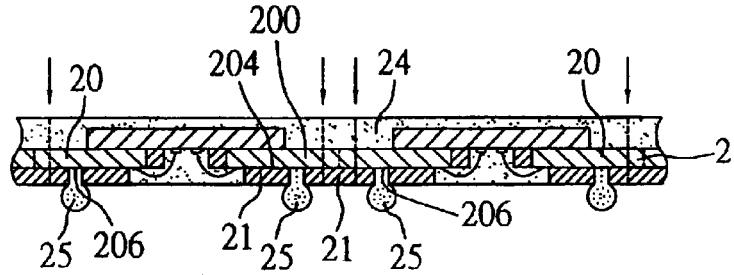

Then, referring to FIG. 2D, a ball-implanting process is performed to implant a plurality of solder balls 25 at the exposed ball-implanting portions 206 on the lower surfaces 204 of the leads 200, wherein the solder balls 25 are greater in height than the thickness of the first resin material 21 pre-molded on the lower surfaces 204 of the leads 200.

Figure 2E:
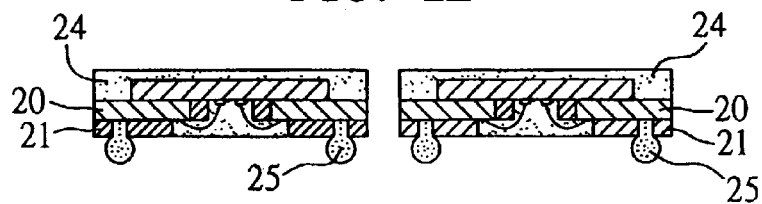

Finally, a singulation process is performed to cut along cutting lines (as indicated by arrows shown in FIG. 2D) through the encapsulant 24, lead-frame strip 2 and first resin material 21, so as to separate the lead frames 20 and form individual semiconductor packages, as shown in FIG. 2E. This thereby completes fabrication of the semiconductor package according to the first embodiment of the invention, wherein the solder balls 25 act as I/O connections of the semiconductor package to electrically connect the chip 22 to an external device such as printed circuit board (PCB, not shown).

Second Preferred Embodiment

Figure 3A:
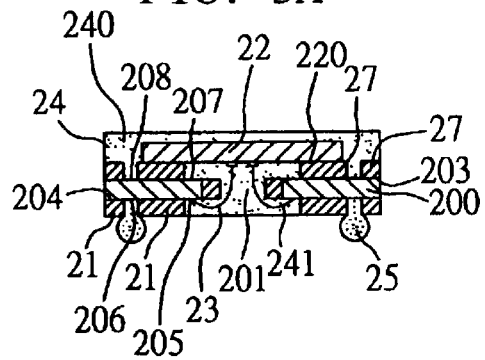
FIG. 3A is a cross-sectional view of the semiconductor package according to a second preferred embodiment of the invention.

FIG. 3A illustrates a semiconductor package according to a second preferred embodiment of the invention, which is structural similar to the above first embodiment and has components or elements thereof being designated by same reference numerals as those used in the first embodiment.

Figure 3B:
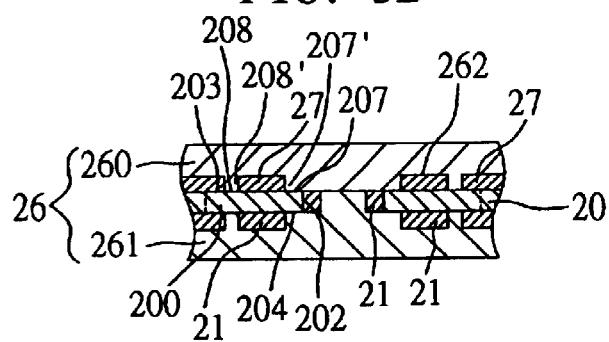
FIG. 3B is a schematic diagram for fabricating a lead frame of the semiconductor package shown in FIG. 3A.
Figure 3C:
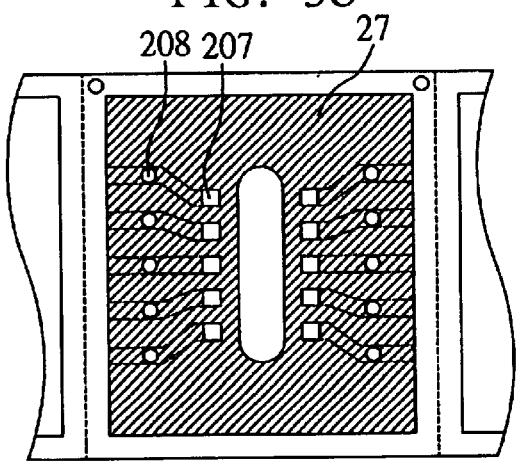
FIG. 3C is a top view of the lead frame shown in FIG. 3B with wire-bonding portions and ball-implanting portions thereof being exposed to outside of a second resin material.

As shown in FIG. 3A, the semiconductor package according to this embodiment differs from the above first embodiment in that, a second resin material 27 is pre-molded on the upper surfaces 203 of the leads 200, and simultaneously formed with the first resin material 21 pre-molded on the lower surfaces 204 of the leads 200 during fabrication of the lead frame 20, wherein the second resin material 27 can be the same material as the first resin material 21. Moreover, the upper surface 203 of each of the leads 200 is defined with a wire-bonding corresponding portion 207 and a ball-implanting corresponding portion, 208 that respectively correspond in position to the wire-bonding portion 205 and the ball-implanting portion 206 on the lower,surface 204 of the lead 200. In the above pre-molding process, as shown in FIG. 3B, the lead frame 20 is clamped between the upper and lower molds 260, 261 of the encapsulation mold 26, wherein the bottom surface 262 of the upper mold 260 is formed with a plurality of protrusions 207' corresponding in position to the wire-bonding corresponding portions 207, and protrusions 208' corresponding in position to the ball-implanting corresponding portions 208. During pre-molding, the wire-bonding corresponding portions 207 and ball-implanting corresponding portions 208 on the upper surfaces 203 of the leads 200 closely abut against the protrusions 207', 208' of the upper mold 260; the second resin material 27 is injected into the mold 26 and fills into gaps between the bottom surface 262 of the upper mold 260 and the upper surfaces 203 of the leads 200 without flashing to the wire-bonding corresponding portions 207 and ball-implanting corresponding portions 208, thereby making the wire-bonding corresponding portions 207 and ball-implanting corresponding portions 208 exposed to outside of the second resin material 27, as shown in FIG. 3C. With the second resin material 27 being the same material as the first resin material 21, the first and second resin materials 21, 27 can be simultaneously pre-molded on the lead frame 20; as a result, the lower surfaces 204 and terminals 202 of the leads 200 are encapsulated by the first resin material 21, and the upper surfaces 203 of the leads 200 are encapsulated by the second resin material 27; the fabricated lead frame 20 is readily subject to subsequent processes (as shown in FIG. 3A).

Then, at least a chip 22 is mounted on the lead frame 20 in a manner that the active surface 220 of the chip 22 is attached to the second resin material 27 and covers the opening 201 of the lead frame 20. The chip 22 is electrically connected to the lower surfaces 204 of the leads 200 by a plurality of bonding wires 23 formed in the opening 201.

Next, an encapsulant 24 is formed on the lead frame 20, and has a first portion 240 and a second portion 241, wherein the first portion 240 is formed on the upper surfaces 203 of the leads 200 for encapsulating the chip 22 and the wire-bonding corresponding portions 207 and ball-implanting corresponding portions 208 of the leads 200, and the second portion 241 of the encapsulant 24 fills into the opening 201 of the lead frame 20 for encapsulating the bonding wires 23.

Finally, a plurality of solder balls 25 are implanted at the ball-implanting portions 206 on the lower surfaces 204 of the leads 20; this completes fabrication of the semiconductor package.

The above WBGA semiconductor packages of the first and second embodiments yield significant benefits; a lead frame serves as a chip carrier without having to use an expensive substrate (such as ceramic substrate, organic substrate, etc.), making fabrication costs of the semiconductor package effectively reduced. Moreover, a resin material (instead of conventional solder mask) is pre-molded on leads of the lead frame; compared to solder mask, the resin material has better adhesion to the leads and smaller moisture absorbability than solder mask, and thus helps prevent delamination between the resin material and leads from occurrence. The resin material can be pre-molded on the lead frame before fabrication of the WBGA package, thereby not increasing process complexity for package fabrication. During pre-molding the resin material, the leads of the lead frame are tightly clamped by a mold without having resin flash formed on wire-bonding portions and ball-implanting portions of the leads, so as to allow bonding wires to be completely bonded to the wire-bonding portions. Furthermore, in a molding process for forming an encapsulant on the lead frame, the encapsulant filling into the opening for encapsulating the bonding wires has its exposed surface flush with an exposed surface of the resin material pre-molded on the leads. This flush arrangement makes the encapsulant not protrude beyond the resin material and thus not flash to the ball-implanting portions of the leads, such that solder balls can be completely bonded to the ball-implanting portions, and electrical-connection quality and yield of the semiconductor package can be assured.

Third Preferred Embodiment

Figure 4:
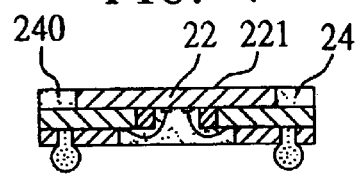
FIG. 4 is a cross-sectional view of the semiconductor package according to a third preferred embodiment of the invention.

FIG. 4 illustrates a semiconductor package according to a third preferred embodiment of the invention, which is structural similar to the above first embodiment and has components or elements thereof being designated by same reference numerals as those used in the first embodiment.

As shown in FIG. 4, the semiconductor package of this embodiment differs from the above first embodiment in that, the non-active surface 221 of the chip 22 is exposed to outside of the first portion 240 of the encapsulant 24 (i.e. naked-chip package), such that heat produced from the chip 22 can be dissipated via the exposed non-active surface 221 out of the semiconductor package, thereby improving heat dissipating efficiency of the semiconductor package.

Fourth Preferred Embodiment

Figure 5A:
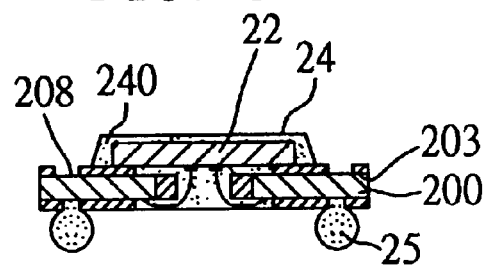
FIG. 5A is a cross-sectional view of the semiconductor package according to a fourth preferred embodiment of the invention.

FIG. 5A illustrates a semiconductor package according to a fourth preferred embodiment of the invention, which is structural similar to the above second embodiment and has components or elements thereof being designated by same reference numerals as those used in the second embodiment.

Figure 5B:
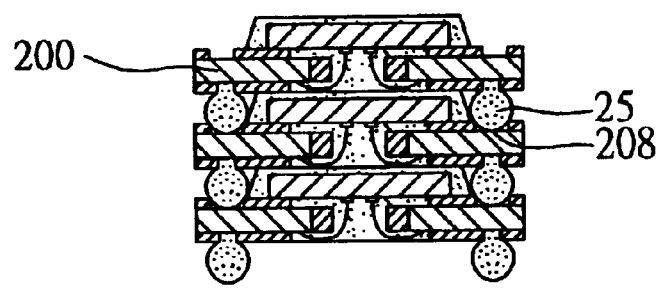
FIG. 5B is a schematic diagram showing stacking of the semiconductor packages shown in FIG. 5A.
Figure 6A:
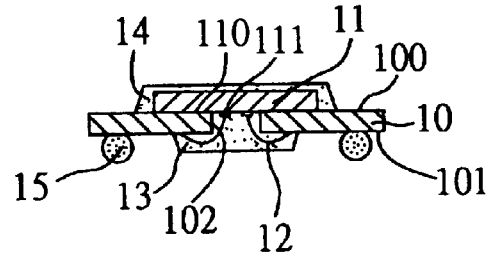
FIG. 6A (PRIOR ART) is a cross-sectional view of a conventional semiconductor package.
Figure 6B:
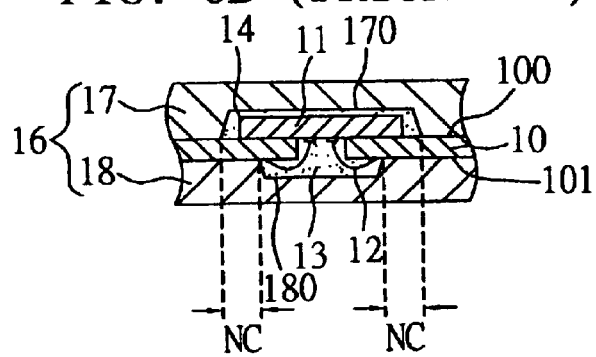
FIG. 6B (PRIOR ART) is a schematic diagram showing a molding process for forming an encapsulant of the semiconductor package shown in FIG. 6A.
Figure 6C:
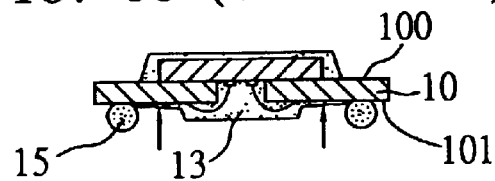
FIG. 6C (PRIOR ART) is a schematic diagram showing the occurrence of resin flash during formation of the encapsulant shown in FIG. 6B.

As shown in FIG. 5A, the semiconductor package of this embodiment differs from the above second embodiment in that, the first portion 240 of the encapsulant 24 formed on the first surfaces 203 of the leads 200 sufficiently encapsulates the chip 22 but exposes the ball-implanting corresponding portions 208 of the leads 200, and solder balls 25 are implanted at positions on the lower surfaces 204 of the leads 200 corresponding in position to the ball-implanting corresponding portions 208. As shown in FIG. 5B, when a plurality of the semiconductor packages are vertically stacked, solder balls 25 of an upper semiconductor package abut against exposed ball-implanting corresponding portions 208 of a lower semiconductor package to form a stacked package structure that provides enhanced operational performances; and, the above naked-chip package arrangement of the third embodiment can also be applied to the stacked package structure shown in FIG. 5B.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A window-type ball grid array (WBGA) semiconductor package with a lead frame as a chip carrier, comprising:

a lead frame having a plurality of leads that encompass an opening penetrating through the lead frame, wherein each of the leads has a terminal toward the opening, an upper surface, and a lower surface opposed to the upper surface and defined with a wire-bonding portion and a ball-implanting portion thereon;

a first resin material pre-molded on the lower surfaces and terminals of the leads, allowing the wire-bonding portions and ball-implanting portions to be exposed to outside of the first resin material;

at least a chip having an active surface and a non-active surface opposed to the active surface, wherein the active surface is mounted on the upper surfaces of the leads and covers the opening of the lead frame, allowing a plurality of bond pads formed on the active surface to be exposed to the opening;

a plurality of bonding wires for electrically connecting the bond pads of the chip to the wire-bonding portions of the leads via the opening of the lead frame;

an encapsulant formed on the lead frame, the encapsulant having a first portion and a second portion, wherein the first portion is formed on the upper surfaces of the leads for encapsulating the chip, and the second portion of the encapsulant fills into the opening for encapsulating the bonding wires, wherein an exposed bottom surface of the second portion is flush with an exposed surface of the first resin material; and a plurality of solder balls implanted at the ball-implanting portions of the leads.

2. The WBGA semiconductor package of claim 1, further comprising: a second resin material pre-molded on the upper surfaces of the leads, allowing the active surface of the chip to be mounted on the second resin material, which is interposed between the chip and the lead frame and encapsulated by the first portion of the encapsulant.

3. The WBGA semiconductor package of claim 2, wherein the upper surface of each of the leads is defined with a wire-bonding corresponding portion and a ball-implanting corresponding portion, which respectively correspond in position to the wire-bonding portion and the ball-implanting portion on the lower surface of each of the leads and are exposed to outside of the second resin material.

4. The WBGA semiconductor package of claim 2, wherein the first resin material is the same as the second resin material.

5. The WBGA semiconductor package of claim 1, wherein the first resin material pre-molded on the lower surfaces of the leads is greater in thickness than height of wire loops of the bonding wires protruding from the lower surfaces of the leads.

6. The WBGA semiconductor package of claim 1, wherein the non-active surface of the chip is exposed to outside of the encapsulant.

7. The WBGA semiconductor package of claim 3, wherein the ball-implanting corresponding portions of the leads are exposed to outside of the encapsulant, such that when a plurality of the semiconductor packages are vertically stacked, solder balls of an upper semiconductor package abut against exposed ball-implanting corresponding portions of a lower semiconductor package.

8. A method for fabricating a window-type ball grid array (WBGA) semiconductor package with a lead frame as a chip carrier, comprising the steps of:

preparing a lead frame having a plurality of leads that encompass an opening penetrating through the lead frame, each of the leads having a terminal toward the opening, an upper surface, and a lower surface opposed to the upper surface and defined with a wire-bonding portion and a ball-implanting portion thereon, wherein a first resin material is pre-molded on the lower surfaces and terminals of the leads, allowing the wire-bonding portions and ball-implanting portions to be exposed to outside of the first resin material;

preparing at least a chip having an active surface and a non-active surface opposed to the active surface, and mounting the active surface on the upper surfaces of the leads, wherein the active surface of the chip covers the opening of the lead frame, and a plurality of bond pads formed on the active surface are exposed to the opening;

forming a plurality of bonding wires for electrically connecting the bond pads of the chip to the wire-bonding portions of the leads via the opening of the lead frame;

forming an encapsulant on the lead frame, the encapsulant having a first portion and a second portion, wherein the first portion is formed on the upper surfaces of the leads for encapsulating the chip, and the second portion of the encapsulant fills into the opening for encapsulating the bonding wires, wherein an exposed bottom surface of the second portion is flush with an exposed surface of the first resin material; and implanting a plurality of solder balls at the ball-implanting portions of the leads.

9. The method of claim 8, wherein in the step of preparing the lead frame, a second resin material is pre-molded on the upper surfaces of the leads, allowing the active surface of the chip to be mounted on the second resin material, which is interposed between the chip and the lead frame and encapsulated by the first portion of the encapsulant.

10. The method of claim 9, wherein the upper surface of each of the leads is defined with a wire-bonding corresponding portion and a ball-implanting corresponding portion, which respectively correspond in position to the wire-bonding portion and the ball-implanting portion on the lower surface of each of the leads and are exposed to outside of the second resin material.

11. The method of claim 9, wherein the first resin material is the same as the second resin material.

12. The method of claim 8, wherein the first resin material encapsulated over the lower surfaces of the leads is greater in thickness than height of wire loops of the bonding wires protruding from the lower surfaces of the leads.

13. The method of claim 8, wherein the non-active surface of the chip is exposed to outside of the encapsulant.

14. The method of claim 10, wherein the ball-implanting corresponding portions of the leads are exposed to outside of the encapsulant, such that when a plurality of the semiconductor packages are vertically stacked, solder balls of an upper semiconductor package abut against exposed ball-implanting corresponding portions of a lower semiconductor package.

15. A method for fabricating a window-type ball grid array (WBGA) semiconductor package with a lead frame as a chip carrier, comprising the steps of:

preparing a lead frame having a plurality of leads that encompass an opening penetrating through the lead frame, each of the leads having a terminal toward the opening, an upper surface, and a lower surface opposed to the upper surface, wherein a wire-bonding portion and a ball-implanting portion are defined on the lower surface, and a wire-bonding corresponding portion and a ball-implanting corresponding portion are defined on the upper surface respectively corresponding in position to the wire-bonding portion and the ball-implanting portion on the lower surface of each of the leads; and pre-molding a resin material on the upper and lower surfaces and terminals of the leads, allowing the wire-bonding portions, ball-implanting portions, wire-bonding corresponding portions and ball-implanting corresponding portions to be exposed to outside of the resin material;

preparing at least a chip having an active surface and a non-active surface opposed to the active surface, and mounting the active surface on the upper surfaces of the leads, wherein the active surface of the chip covers the opening of the lead frame, and a plurality of bond pads formed on the active surface are exposed to the opening;

forming a plurality of bonding wires for electrically connecting the bond pads of the chip to the wire-bonding portions of the leads via the opening of the lead frame;

forming an encapsulant on the lead frame, the encapsulant having a first portion and a second portion, wherein the first portion is formed on the upper surfaces of the leads for encapsulating the chip, and the second portion of the encapsulant fills into the opening for encapsulating the bonding wires, wherein an exposed bottom surface of the second portion is flush with an exposed surface of the first resin material; and implanting a plurality of solder balls at the ball-implanting portions of the leads.

16. The method of claim 15, wherein the non-active surface of the chip is exposed to outside of the encapsulant.

17. The method of claim 15, wherein the ball-implanting corresponding portions of the leads are exposed to outside of the encapsulant, such that when a plurality of the semiconductor packages are vertically stacked, solder balls of an upper semiconductor package abut against exposed ball-implanting corresponding portions of a lower semiconductor package.

* * * * *